United States Patent
Adamski et al.

[11] Patent Number: 6,020,797
[45] Date of Patent: Feb. 1, 2000

[54] ELECTRODE CONNECTION CONFIGURATION AND METHOD FOR A MULTI-POLE MONOLITHIC CRYSTAL FILTER

[75] Inventors: Jaroslaw E. Adamski, Streamwood; Charles L. Zimnicki, Bartlett; Richard T. Wong, Streamwood, all of Ill.

[73] Assignee: CTS Corporation, Elkhart, Ind.

[21] Appl. No.: 09/137,727

[22] Filed: Aug. 21, 1998

[51] Int. Cl.⁷ .................................................. H03H 9/56
[52] U.S. Cl. .......................... 333/191; 333/192; 310/366
[58] Field of Search .................................... 333/186–192; 310/320, 321, 366

[56] References Cited

U.S. PATENT DOCUMENTS

| | | | |
|---|---|---|---|
| 3,573,672 | 4/1971 | Fair et al. | 333/191 |
| 3,676,805 | 7/1972 | Mason | 310/321 X |
| 3,974,405 | 8/1976 | Schussler et al. | 310/320 |
| 4,156,214 | 5/1979 | Arvanitis et al. | 333/191 |
| 4,163,959 | 8/1979 | Dailing | 333/191 |
| 4,229,718 | 10/1980 | Arvanitis et al. | 333/192 |
| 4,281,300 | 7/1981 | Arvanitis | 333/189 X |
| 4,329,666 | 5/1982 | Arvanitis | 333/191 |
| 4,342,014 | 7/1982 | Arvanitis | 333/191 |
| 4,481,448 | 11/1984 | Dworsky | 310/320 X |
| 4,533,885 | 8/1985 | Higgins, Jr. | 333/191 |
| 5,075,651 | 12/1991 | Pradal | 333/187 |
| 5,084,647 | 1/1992 | Inoue et al. | 310/320 |
| 5,661,443 | 8/1997 | Mancini | 333/191 |

FOREIGN PATENT DOCUMENTS 63-54816  3/1988  Japan .................................. 333/187 F

*Primary Examiner*—Benny Lee
*Assistant Examiner*—Barbara Summons
*Attorney, Agent, or Firm*—Jones, Day, Reavis & Pogue

[57] ABSTRACT

A multi-pole monolithic crystal filter with at least three acoustically coupled resonators (50,52,54) on a piezoelectric blank (56). Each resonator (50,52,54) has associated top and bottom electrodes (70,72,74,76,78,80). An input connection (62) is coupled to the top electrode (70) of a first resonator (50) and a ground connection (64) is coupled to the bottom electrode (72) of the first resonator (50). An output connection (68) is coupled to the bottom electrode (80) of a last resonator (54) and a ground connection (66) is coupled to the top electrode (78) of the last resonator (54). The top and bottom electrodes (74,76) of each of the remaining resonators (52) are coupled to each other.

5 Claims, 2 Drawing Sheets

ELECTRODE CONNECTION CONFIGURATION AND METHOD FOR A MULTI-POLE MONOLITHIC CRYSTAL FILTER

FIELD OF THE INVENTION

The present invention relates generally to piezoelectric crystal devices and, in particular, to an apparatus and method for a multi-pole monolithic crystal filter.

BACKGROUND OF THE INVENTION

Piezoelectric crystal filters are commonly found in analog and digital radio communication devices. Typically, radio devices require filters to have a number of poles depending on the frequency response requirements of the radio. In the design of a radio, for example, the sensitivity and selectivity are specified and the designer incorporates filters having the requisite number of poles to provide the specified sensitivity and selectivity. If, for example, a two-pole filter will not provide the required selectivity, two or more cascaded two-pole monolithic crystal filters may be used.

In addition, the trend in radio devices is towards smaller and lighter construction. Adding two-pole filters in a radio to improve selectivity goes contrary to this trend. There have been some efforts to provide multiple-pole monolithic devices within a single package. However, these devices tend to be harder to produce. Also, additional poles require additional electrical connections to connect to all of the individual resonators of the filter. This requires a larger package or a piezoelectric device with a smaller active area to accommodate the additional electrical connections. Both of these conditions are undesirable.

FIG. 1 shows a prior art three-pole monolithic filter incorporating three resonators. A piezoelectric plate 16 has an upper 18 and a lower surface 20 with three resonators 10,12,14 defined by opposing electrode pairs. An input electrical trace 22 is coupled to a top electrode 30 of a first resonator 10 and a first ground electrical trace 24 is coupled to a bottom electrode 32 of the first resonator 10. An output electrical trace 26 is coupled to a bottom electrode 40 of a last resonator 14 and a second ground electrical trace 28 is coupled to a top electrode 38 of the last resonator 14. A third ground electrical trace 42 is coupled to a top electrode 34 of a middle resonator 12 with a bottom electrode 36 of the middle resonator 12 coupled to the bottom electrodes 32,40 of the first and last resonators 10,14.

As can be seen, the third ground electrical trace 42 requires additional room on the piezoelectric plate 16 to run towards an edge of the plate. As is known in the art, vibrations under the active area (electrodes) of the filter resonators must not be dampened if at all possible. This can only be accomplished by mounting the plate or wirebonding to the electrodes at locations on the plate furthest away from the active area. This has necessitated the use of devices such as the third electrical trace 42 in prior art multi-pole filters. Disadvantageously, this filter and its electrical connections can only be realized by using a larger plate which requires a larger package or by shrinking the active area (electrodes) on the piezoelectric plate which impairs performance.

FIG. 2 shows a second prior art device which is a two-pole filter. This device is similar to the description of the prior art device of FIG. 1, described above. However, this device, instead of having a middle resonator, has narrow shield electrodes 46 between the input and output electrodes 30,40. In addition, this device has the input and output electrical traces 22,26 on different sides of the piezoelectric plate and a fourth ground trace 44 coupled to a bottom shield electrode. Nevertheless, this two-pole filter has the same disadvantage as the three-pole filter of FIG. 1, in that, the third (and fourth) ground electrical trace 42(44) requires additional room on the piezoelectric plate 16.

There is a need for a monolithic crystal filter having three or more poles to provide improved selectivity in a radio without the drawback of using a larger blank or smaller active area to provide room for additional electrical traces. Accordingly, an ability to provide a multi-pole monolithic crystal filter that can be enclosed in the same size packaging and on the same size piezoelectric blank as existing two-pole filters would be an improvement over the prior art.

DETAILED DESCRIPTION OF THE PREFERRED EMBODIMENT

The present invention provides a multi-pole monolithic crystal filter of three poles or more with an electrical connection configuration that eliminates side electrical traces for connecting to electrodes of central resonators. The novel configuration minimizes the area required for connections on a crystal blanks. This has been accomplished by integrating central resonator electrode connections with neighboring ground connections. Advantageously, multi-pole filters can be provided on piezoelectric blanks having the same dimensions as a corresponding two-pole filter and without the need for larger packaging.

Figure 1:
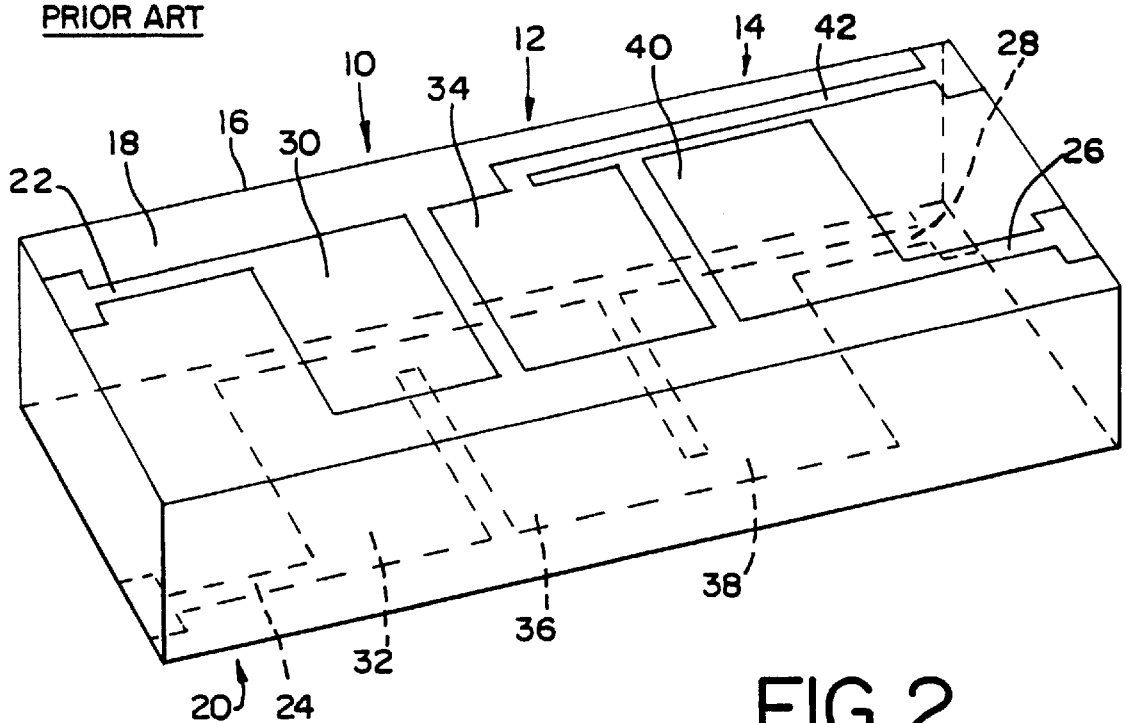
FIG. 1 shows a perspective view of a prior art three-pole monolithic filter.
Figure 2:
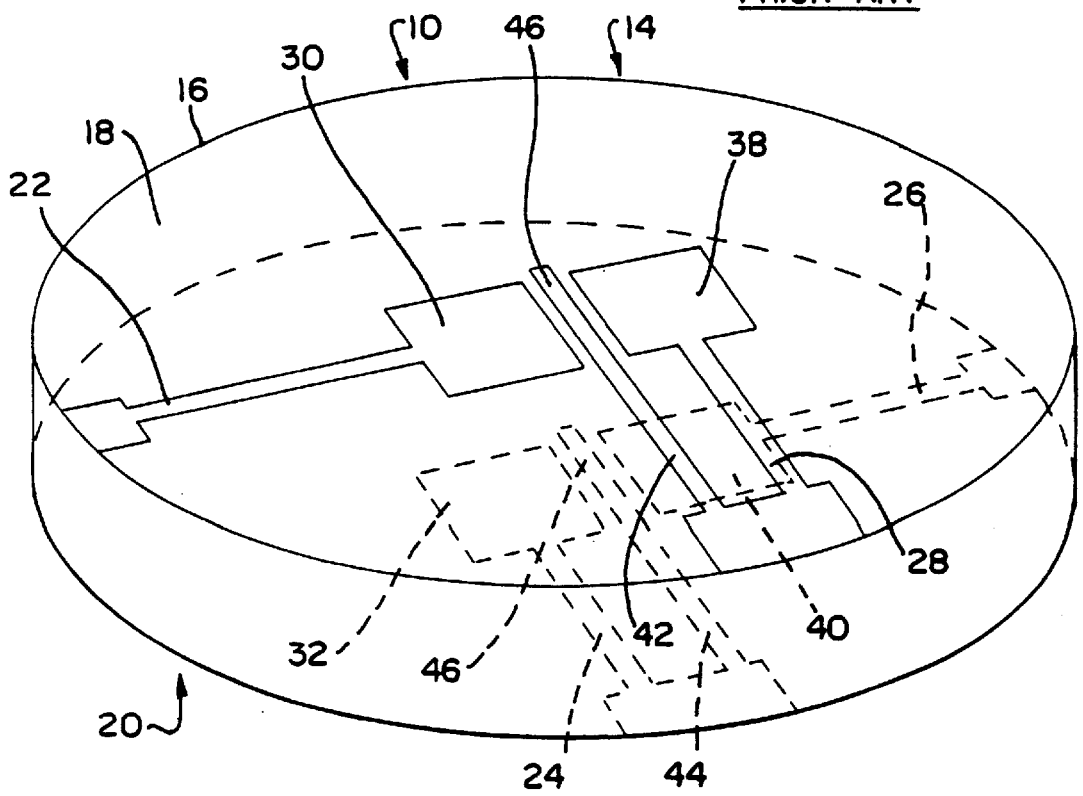
FIG. 2 shows a perspective view of a prior art two-pole monolithic filter with shield electrodes.
Figure 3:
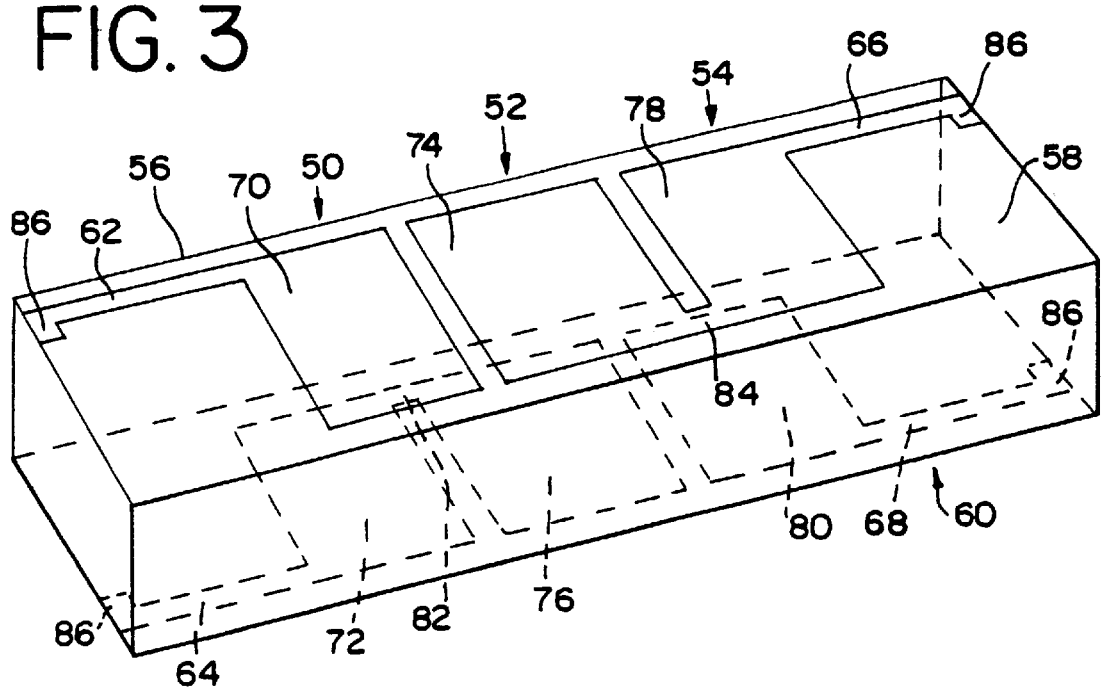
FIG. 3 shows a perspective view of a multi-pole monolithic filter, in accordance with the present invention.

FIG. 3 shows a three-pole embodiment of the present invention. A piezoelectric blank 56 has major opposing upper 58 and lower surfaces 60 with at least three acoustically coupled resonators 50,52,54 defined by opposing electrode pairs disposed thereon. An input electrical connection 62 is coupled to a top electrode 70 of a first resonator 50 and a first ground electrical connection 64 is coupled to a bottom electrode 72 of the first resonator 50. An output electrical connection 68 is coupled to a bottom electrode 80 of a last resonator 54 and a second ground electrical connection 66 is coupled to a top electrode 78 of the last resonator 54. The top and bottom electrodes 74,76 of each remaining resonator 52 are coupled to a similar potential (e.g., connected to each other and electrically floating or commonly coupled to the same potential such as ground). It should be recognized that the present invention can easily be expanded into embodiments having four or more poles, in accordance with the above description.

In a preferred embodiment, a bottom electrode 76 of all of the remaining (i.e., middle) resonators 52 is commonly coupled to the bottom electrode 72 of the first resonator 50 via a single first electrical trace 82, and a top electrode 74 of all of the remaining (i.e., middle) resonators 52 is commonly coupled to the top electrode 78 of the last resonator 54 via a single second electrical trace 84. More preferably, the top and bottom electrodes 74,76 of each remaining resonator 52 are coupled to ground via the first and second ground electrical connections 64,66.

As can be seen, any extraneous electrical traces to the middle resonators have been advantageously eliminated, thereby eliminating the prior art requirement for additional room on the piezoelectric plate to run a trace towards an edge of the plate.

Preferably, the top and bottom electrodes of all the resonators have substantially similar horizontal and vertical dimensions, and the resonators are located colinearly along a horizontal direction of the piezoelectric blank. In addition, it is preferred that all of the connections and electrical traces to the electrodes on the piezoelectric blank are located entirely within a boundary defined by imaginary lines positioned at about the extent of the vertical dimensions of the electrodes and extending horizontally across the piezoelectric blank. In other words, a vertical dimension of the resonators can extend very near to the edge of the piezoelectric blank without the need to leave space for electrical connections to an edge of the piezoelectric blank.

In a preferred embodiment, the piezoelectric plate is of quartz. More preferably, the piezoelectric plate is of an AT-cut crystallographic orientation of quartz with the pairs of electrodes aligned along the X or Z crystallographic axis of the quartz. However, it should be recognized that all other piezoelectric materials and orientations commonly known in the art can be used equally well without limitation.

In addition, the present invention is best realized on a piezoelectric plate that is rectangular in shape, i.e., has a rectangular upper and lower surface, or for those piezoelectric plates where space along one or two dimensions is an issue. In the above example, the piezoelectric blank is rectangular with its long dimension along a horizontal direction.

In a preferred embodiment, the resonators are positioned colinearly, defined as the center of each resonator lying substantially along a line substantially perpendicular to a center line bisecting the piezoelectric blank, and all resonate at about the same frequency. However, it is not a requirement of the present invention that the resonators be located colinearly on the piezoelectric blank or that they be of the same area or dimensions.

Also, in a preferred embodiment, the electrodes are connected by metallized traces to connection pads 86 located substantially on a periphery of the piezoelectric blank. Typically, the connection pads 86 are used for wirebonding to electrical connections in a hermetic package (not shown). However, other connecting techniques known in the art, such as using conductive adhesives, may be used equally well. In general, package connections to the filter will include an input, an output, and at least one ground connection. However, there is an advantage in using two separate ground connections where ground loop currents cause problems.

Typically, the filter requires impedance matching networks for the input and output of the filter, as is known in the art. These networks are generally used to complex conjugately impedance match the filter to a fifty-ohm source or load. However, it should be recognized that other source and load impedances may be presented to the filter. This can require a change of electrode position or dimensions. It should be recognized that many impedance matching configurations may be used successfully in the present invention. For example, low pass and high pass configurations may be used, and the matching from a filter to a source or load may be from either high-to-low impedance or low-to-high impedance, each requiring different circuitry. However, in substantially all cases, a complex conjugate impedance match is preferred to provide low insertion loss.

Figure 4:
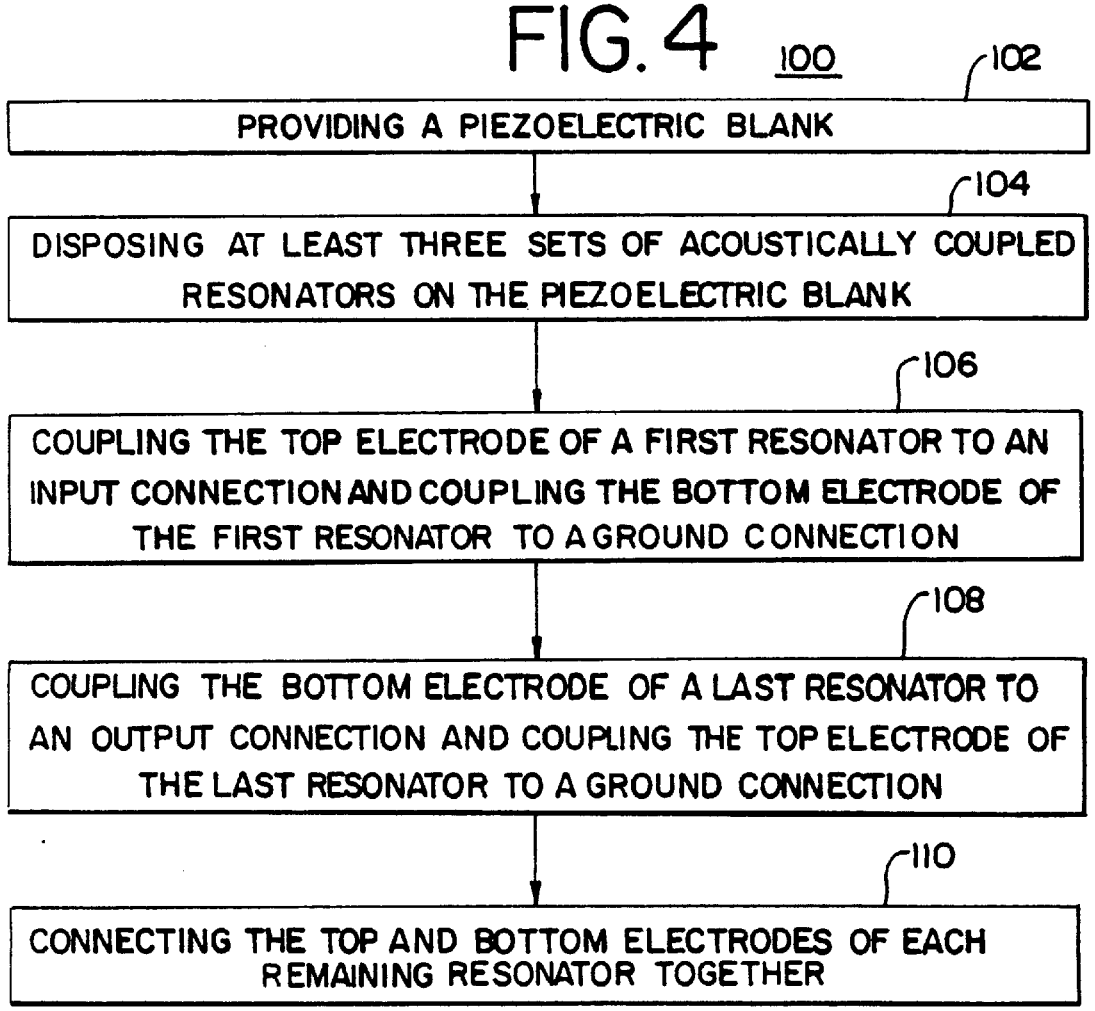
FIG. 4 shows a flow diagram of a method to provide a electrode connection configuration for a multi-pole monolithic crystal filter, in accordance with the present invention.

Referring to FIG. 4, a method 100 for improving the electrical connection configuration of a monolithic multi-pole monolithic crystal filter is shown. The first step 102 includes providing a piezoelectric blank having an upper and a lower surface. Preferably, the piezoelectric blank in the providing step is rectangular. More preferably, the piezoelectric blank is of an AT-cut crystallographic orientation of quartz. However, it should be recognized that all other piezoelectric materials commonly known in the art can be used equally well without limitation.

A second step 104 includes disposing at least three sets of opposing top and bottom electrodes defining acoustically coupled resonators on the piezoelectric blank. Vapor deposition is typically employed to dispose the resonators on the blank. The resonators include a first resonator corresponding to an input side of the filter, a last resonator corresponding to an output side of the filter, and the remaining middle resonators. Each electrode is preferably formed of an electrically conductive material, typically aluminum or chrome/gold, which is plated on the upper and lower surfaces of the piezoelectric blank to a predetermined thickness.

A third step 106 includes coupling the top electrode of a first resonator to an input connection and coupling the bottom electrode of the first resonator to a ground connection. This coupling can be accomplished by depositing a thin strip of electrically conductive material which is large enough to provide a low resistance connection to the electrodes.

A fourth step 108 includes coupling the bottom electrode of a last resonator to an output connection and coupling the top electrode of the last resonator to a ground connection. This coupling can be accomplished by depositing a thin strip of electrically conductive material which is large enough to provide a low resistance connection to the electrodes.

A last step 110 includes connecting the top and bottom electrodes of each remaining resonator to a similar potential. This can be accomplished by connecting each top and bottom electrode pair together or to different connections having the same potential, e.g. ground or source. Preferably, the connecting step includes the top and bottom electrodes of each remaining resonator being coupled to ground.

In a preferred embodiment, the present invention further includes steps of commonly connecting the bottom electrodes of the first resonator and the remaining resonators with a single first electrical trace, and commonly connecting the top electrodes of the last resonator and the remaining resonators with a single second electrical trace. More preferably, the first and second electrical traces are coupled to ground. These common connecting steps can be accomplished by depositing thin strips of electrically conductive material which are large enough to provide a low resistance connection between the electrodes.

Also, in a preferred embodiment the disposing step includes disposing the top and bottom electrodes of all the resonators to have substantially similar horizontal and vertical dimensions, and disposing the resonators colinearly along a horizontal direction of the piezoelectric blank. In addition, the commonly connecting steps include connecting all of the connections and electrical traces to the electrodes entirely within a boundary defined by imaginary lines positioned at about the extent of the vertical dimensions of the electrodes and extending horizontally across the piezoelectric blank. This allows for the provision of the largest possible active area within a limiting dimension of the piezoelectric blank.

One of the novel aspects of the present invention is to provide multiple colinearly-positioned resonators on a piezoelectric blank with none of the electrical traces or connections extending beyond one dimension of the resonators. Advantageously, the piezoelectric blank can have a minimum size along the one dimension of the resonators. In other words, the one dimension of the resonators can extend very near to the edge of the piezoelectric blank without the need to leave space for electrical connections to electrodes. This is most useful with rectangular piezoelectric blanks and provides for a filter of minimal package size having improved resistance and insertion loss.

Another of the novel aspects of the present invention is that the electrical connections of the electrodes between the input and output electrodes provide an inherent shielding to improve isolation between the input and output. This improves signal attenuation outside of the filter passband, commonly referred to as ultimate attenuation.

In practice, a monolithic crystal filter embodying the present invention may be advantageously utilized in any application requiring small size and high selectivity. For example, the monolithic crystal filter of the present invention can be used in an intermediate frequency (IF) portion of a radio receiver. Typical radio receivers have an IF portion that operates at about 100 MHz or less. In a radio receiver, a mixer combines a received signal from an antenna with a signal from a local oscillator to provide an IF signal. The IF signal must next be filtered to remove unwanted harmonic signals produced in the mixer. Such filtering can be provided by the monolithic crystal filter of the present invention. It should be understood that the monolithic crystal filter of the present invention can be advantageously utilized in any radio.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A multi-pole monolithic crystal filter, comprising:

a piezoelectric blank having an upper and lower surface;

at least three resonators defined by substantially opposing top and bottom electrode pairs disposed on the upper and lower surfaces of the piezoelectric blank, the at least three resonators being acoustically coupled to each other;

an input connection coupled to the top electrode of a first resonator and a ground connection coupled to the bottom electrode of the first resonator;

an output connection coupled to the bottom electrode of a last resonator and a ground connection coupled to the top electrode of the last resonator;

the top and bottom electrodes of each remaining resonator being coupled to a similar potential;

commonly connecting the bottom electrodes of the first resonator and the remaining resonators with a single first electrical trace;

commonly connecting the top electrodes of the last resonator and the remaining resonators with a single second electrical trace;

the top and bottom electrodes of all the at least three resonators having substantially similar horizontal and vertical dimensions;

the at least three resonators being located colinearly along a horizontal direction of the piezoelectric blank; and all of the connections and electrical traces to the electrodes on the piezoelectric blank being located entirely within a boundary defined by imaginary lines positioned at about an extent of the vertical dimensions of the electrodes and extending horizontally across the piezoelectric blank.

2. The multi-pole monolithic crystal filter of claim 1, wherein the piezoelectric blank is of an AT-cut crystallographic orientation of quartz.

3. The multi-pole monolithic crystal filter of claim 1, wherein the piezoelectric blank is rectangular in shape.

4. A method of providing an improved multi-pole monolithic crystal filter, comprising the steps of:

providing a piezoelectric blank having an upper and a lower surface;

disposing at least three sets of opposing top and bottom electrodes defining acoustically coupled resonators on the piezoelectric blank;

coupling the top electrode of a first resonator to an input connection and coupling the bottom electrode of the first resonator to a ground connection;

coupling the bottom electrode of a last resonator to an output connection and coupling the top electrode of the last resonator to a ground connection;

connecting the top and bottom electrodes of each remaining resonator to a similar potential;

providing the top and bottom electrodes of all the at least three resonators with substantially similar horizontal and vertical dimensions;

locating the at least three resonators colinearly along a horizontal direction of the piezoelectric blank;

commonly connecting the bottom electrodes of the first resonator and the remaining resonators with a single first electrical trace;

commonly connecting the top electrodes of the last resonator and the remaining resonators with a single second electrical trace; and locating all of the connections and electrical traces to the electrodes on the piezoelectric blank entirely within a boundary defined by imaginary lines positioned at about an extent of the vertical dimensions of the electrodes and extending horizontally across the piezoelectric blank.

5. The method of claim 4, wherein the providing step includes providing a piezoelectric blank of an AT-cut crystallographic orientation of quartz.

* * * * *